(12) United States Patent
Zoppi et al.

(10) Patent No.: US 8,729,974 B2
(45) Date of Patent: May 20, 2014

(54) METHOD OF REGULATING A TIMEOUT DELAY INTRODUCED AT START-UP OF A DIGITAL SYSTEM TO ENSURE READINESS OF A MASTER AMPLITUDE-REGULATED CRYSTAL OSCILLATOR AND IMPLEMENTING CIRCUIT

(75) Inventors: Giulio Zoppi, Palermo (IT); Raffaele Iardino, Catania (IT)

(73) Assignee: STMicroelectronics S.r.l., Agrate Brianza (MB) (IT)

( * ) Notice: Subject to any disclaimer, the term of this patent is extended or adjusted under 35 U.S.C. 154(b) by 76 days.

(21) Appl. No.: 13/463,953

(22) Filed: May 4, 2012

(65) Prior Publication Data
US 2013/0002365 A1 Jan. 3, 2013

(30) Foreign Application Priority Data
Jun. 29, 2011 (IT) .............................. MI2011A1196

(51) Int. Cl.
*H03B 5/32* (2006.01)
*H03L 5/00* (2006.01)

(52) U.S. Cl.
USPC ............ 331/158; 331/172; 331/183; 331/186

(58) Field of Classification Search
USPC ......... 331/154, 158, 160, 172, 173, 182, 183, 331/185, 186
See application file for complete search history.

(56) References Cited

U.S. PATENT DOCUMENTS

| | | | | |
|---|---|---|---|---|
| 5,770,980 A * | 6/1998 | Barrett, Jr. et al. | ..... | 331/116 FE |
| 5,834,982 A * | 11/1998 | Watanabe et al. | ............. | 331/109 |
| 5,909,152 A * | 6/1999 | Li et al. | .................. | 331/116 FE |
| 6,028,491 A * | 2/2000 | Stanchak et al. | ................ | 331/75 |
| 6,052,036 A * | 4/2000 | Enstrom et al. | ................ | 331/176 |
| 6,154,097 A * | 11/2000 | Yoshioka | ........................ | 331/18 |
| 6,191,662 B1 * | 2/2001 | Volk | ............................. | 331/158 |
| 6,798,301 B1 * | 9/2004 | Balan et al. | ..................... | 331/74 |
| 7,227,426 B2 * | 6/2007 | Kaizuka | ........................ | 331/186 |
| 7,262,671 B2 * | 8/2007 | Maeder | ........................ | 331/183 |
| 7,616,074 B2 * | 11/2009 | Toffolon et al. | ............... | 331/185 |
| 8,143,961 B2 * | 3/2012 | Mastovich | ..................... | 331/158 |
| 8,188,802 B2 * | 5/2012 | Garcia | ........................ | 331/185 |
| 2004/0160285 A1 | 8/2004 | Lovelace et al. | | |
| 2005/0151596 A1 | 7/2005 | Lin | | |
| 2005/0285689 A1 | 12/2005 | Wu et al. | | |
| 2006/0097812 A1 | 5/2006 | Maeder | | |
| 2010/0066458 A1 | 3/2010 | Liu et al. | | |

OTHER PUBLICATIONS

IT Search Report and Written Opinion for IT MI2011A001196 mailed Jan. 17, 2012 (7 pages).

* cited by examiner

*Primary Examiner* — Levi Gannon
(74) *Attorney, Agent, or Firm* — Gardere Wynne Sewell LLP

(57) ABSTRACT

A crystal oscillator circuit is configured to output an oscillation signal. A bias circuit responds to control signal to generate a bias current for application to the crystal oscillator circuit. A current generator generates a sense current from the control signal. The sense current is compared to a reference current by a comparator circuit. The comparator circuit generates a ready signal in response to the comparison. The ready signal is indicative of whether the oscillation signal output from the crystal oscillator circuit is ready for use by other circuitry. The reference current may be generated by a circuit which replicates the bias circuit.

21 Claims, 7 Drawing Sheets

METHOD OF REGULATING A TIMEOUT DELAY INTRODUCED AT START-UP OF A DIGITAL SYSTEM TO ENSURE READINESS OF A MASTER AMPLITUDE-REGULATED CRYSTAL OSCILLATOR AND IMPLEMENTING CIRCUIT

PRIORITY CLAIM

This application claims priority from Italian Application for Patent No. MI2011A001196 filed Jun. 29, 2011, the disclosure of which is hereby incorporated by reference.

BACKGROUND

1. Technical Field

This disclosure relates in general to bias-regulated crystal oscillators (briefly X-Osc) and in particular to a way of reliably detecting a state of regulation of the bias current of the oscillator for regulating a timeout period at start-up.

2. Discussion of Prior Art

It is customary to regulate the amplitude of the signal generated by an X-Osc by acting on the X-Osc driver circuit current to keep substantially constant the output signal amplitude and equal to a reference value.

Amplitude regulation eliminates any effect of nonlinear behavior of the driver circuit, therefore the oscillation waveform is cleaner and the crystal itself is safely driven. Without any regulation mechanism both spectral purity and current consumption would be negatively affected.

FIG. 1 shows a basic circuit diagram of a Pierce Crystal Oscillator's driver circuit (the most commonly used architecture) with current regulation. The bock BIAS REGULATOR senses the oscillation and modifies the BIAS CONTROL VOLTAGE until the large signal driver parameters (e.g. large-signal gm) meet the critical values that determine a stable oscillation. Equilibrium is reached when the driver negative output resistance balances the total load resistance, the actual value of which, because of the high Quality Factor of the crystal, is close to the crystal motional resistance).

FIG. 2 shows a typical oscillating voltage and regulating current of the basic circuit of FIG. 1.

Whenever start-up time is an issue, as is the case in stand-alone digital systems, the start-up current of the driver circuit bias current generator should be configurable in order to get the most from the crystal in quickly reaching a stable operation.

On another account, it is important that the master X-Osc of a digital system generate a waveform of adequate quality before a reset process may correctly be initiated and attainment of this indispensable condition is normally assumed to have been reached in a grossly empirical manner by digitally implementing a timeout long enough to reasonably assume that the sinusoidal oscillation generated by the X-Osc has stabilized itself in terms of spectrum and amplitude.

Normally, this timeout digital delay is implemented by counting a given number of clock pulses either with a dedicated counter or alternatively by firmware if a microprocessor or microcontroller is contemplated in the application.

FIG. 3 shows the circuit diagram of FIG. 1, including a BUFFER and a DIGITAL DELAY block for implementing a proper timeout at system start up.

The BUFFER circuit produces a clean square wave from the oscillator's sinusoidal wave.

After the oscillator is enabled, a finite amount of time elapses before the oscillation builds up and the Buffer outputs a first pulse (re: FIGS. 4, 5). Moreover, because the quality of the first CK pulse is rather poor (re: FIG. 4), additional idling time is necessary prior to enabling the CLOCK DISTRIBUTION circuit.

According to the art, a clock pulse count DIGITAL DELAY is employed for introducing a timeout long enough to ensure that the oscillation (having regulation of the X-Osc acting from the stat-up instant) has surely stabilized, under any worst case circumstances. The timeout delay is imposed either by the use of dedicated clock pulse counter or by firmware if a microprocessor or microcontroller is contemplated in the application.

This approach is clearly unrelated to the physical-electrical parameters of the crystal oscillator circuit that may affect its start-up behavior and does not specifically take into account differences among the wealth of crystals and packaging coming from different vendors, which may introduce further uncertainty of both time constant and start-up timing.

In general purpose applications, a timeout delay time is established from worst case analysis overestimation and may in fact be unreasonably longer than necessary by excess precaution.

Where the start-up timing is an issue (e.g. in low power application with short periods of activity or whenever an excessive idle time means waste of energy) the approach of the prior art is unsatisfactory.

Moreover, configurability of the bias current to quicken the start-up process adds an additional level of complexity to the problem because any change in the configured start-up bias conditions may strongly affect the time constant of the X-Osc leading to a precautionary increase of the digitally defined timeout delay and thus of the overall start-up time.

SUMMARY

The applicant has found a manner of reliably detecting a state of regulation of an amplitude-regulated master crystal oscillator (X-Osc) and a way of exploiting such a reliable detection result for controlling the timeout delay being introduced at start-up, thus enhancing the start-up timing and power saving.

The applicant approach of sensing an incipient end of a start-up regulation phase of the bias current of the driver circuit of the crystal oscillator, overcomes the drawbacks of the prior art according to which the stable state of the crystal oscillator is asserted at the elapsing of an eminently empirically calculated timeout delay at start-up.

Basically, the X-Osc start-up regulation event is detected by precisely monitoring the bias current in the driver circuit or a related control signal in order to sense the instant at which the controlled bias current crosses a threshold corresponding to a chosen percentage of its full value at start-up or to a chosen reference value. When this occurs, a flag signal asserting readiness of the master X-Osc is generated, that is at the right instant, thus avoiding any undue excess of duration of the timeout delay that is normally introduced out-of-precaution in known circuits.

According to a further enhanced embodiment, the sensing of the start-up regulation event may be rendered substantially unaffected by differences in the start-up configuration that may be adopted for the application or when using crystals coming from different vendors.

The invention is defined in the annexed claims, the content of which is intended to be integral part of this specification and here incorporated by express reference.

The different aspects and advantages of the novel method and apparatus of this disclosure will become evident through the following description of several exemplary embodiments, making reference to the attached drawings.

DETAILED DESCRIPTION OF THE DRAWINGS

The following detailed description of alternative exemplary embodiments of implementing circuits of the novel method of this disclosure and the related drawings (FIGS. 7-11) to which it refers, have illustrative purpose and should not be intended as limiting the scope of protection as defined in the annexed claims, being the implementing circuits of the present disclosure realizable even with different topologies other than those of the detailed embodiments.

Figure 1:
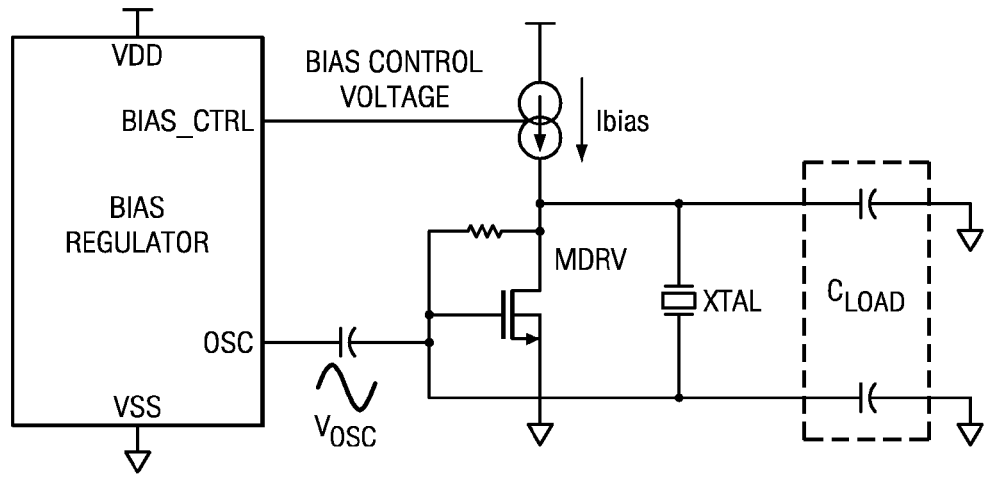
FIG. 1, as already mentioned, is the basic circuit diagram of a well known (Pierce) amplitude regulated crystal oscillator.
Figure 2:
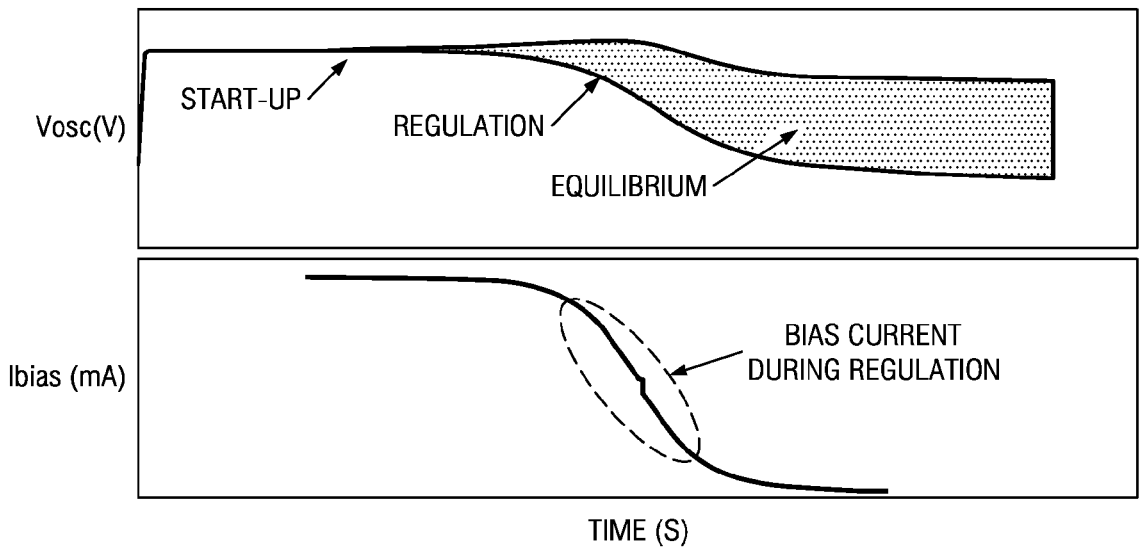
FIG. 2 shows typical oscillation and bias current waveforms for the amplitude regulated crystal oscillator of FIG. 1.
Figure 3:
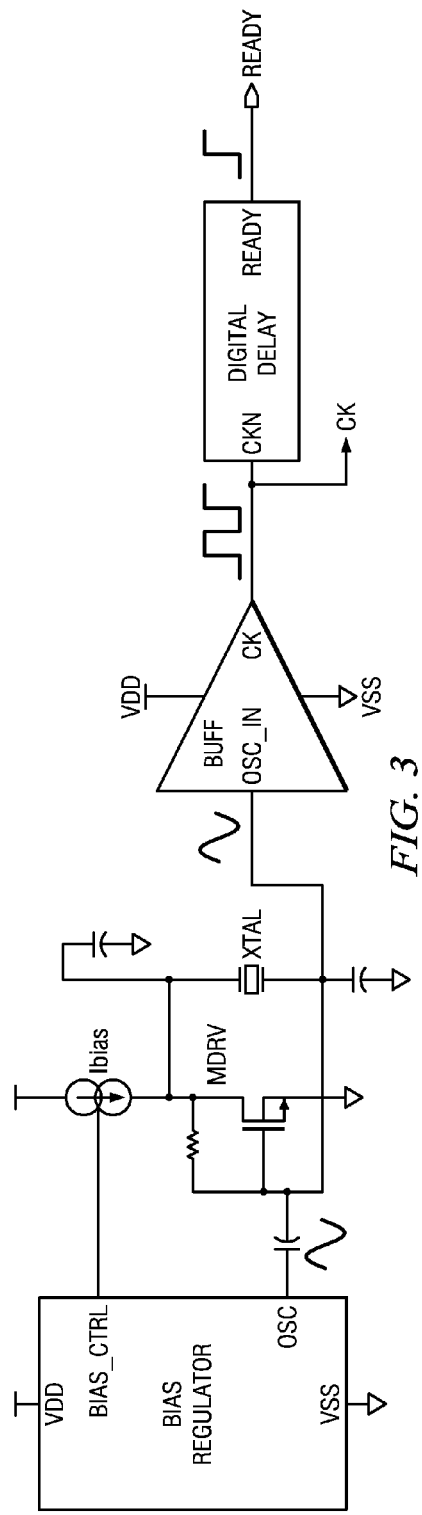
FIG. 3 shows the added circuitry for generating a "ready" flag signal by counting a predetermined number of clock pulses, according to the prior art approach.
Figure 4:
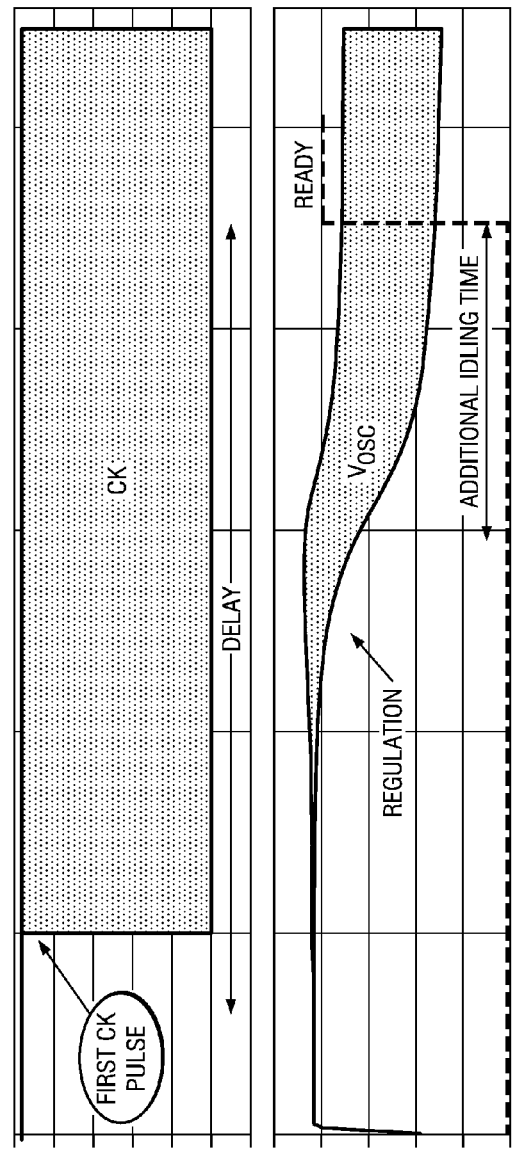
FIG. 4 are time diagrams of a start-up transient showing the unrelated character of the "ready" flag signal generation from any regulating event of the master crystal oscillator start-up phase.
Figure 5:
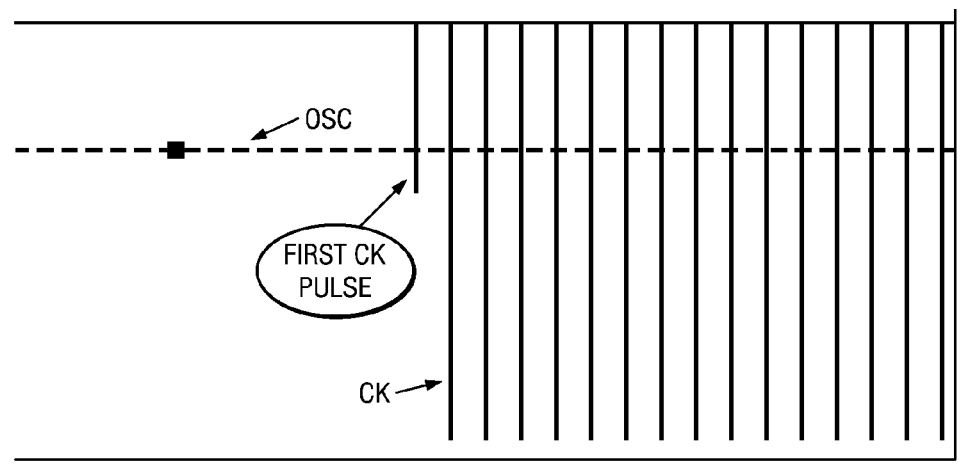
FIG. 5 shows the generally poor quality of the first clock pulse produced from the sinusoidal waveform generated by the oscillator.
Figure 6:
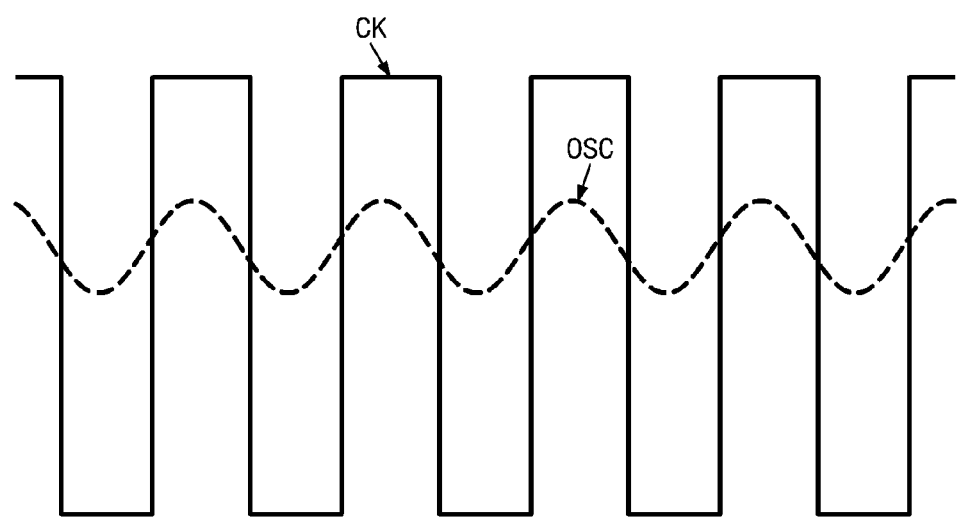
FIG. 6 shows the master crystal oscillator signal during regulation and the master clock signal derived from it.

Briefly reverting to the discussion of the prior art method, the time diagrams of FIG. 2 show that, at start-up, the bias current in the driver circuit of the crystal oscillator remains substantially constant as long as amplitude regulation by the dedicated functional circuit block B$_{IAS}$ R$_{EG}$ of the known circuit of FIG. 1 protracts. Thence the regulating signal output by the B$_{IAS}$ R$_{EG}$ drastically decreases only after the oscillation waveform builds-up in amplitude to a proper level.

This very significant instant, identified in the time diagram by the arrow indicator R$_{EGULATION}$, can be detected as corresponding to the time at which the quality of oscillation is good enough to be safely supplied to any sensitive circuit using it (e.g. a frequency synthesizer).

Figure 7:
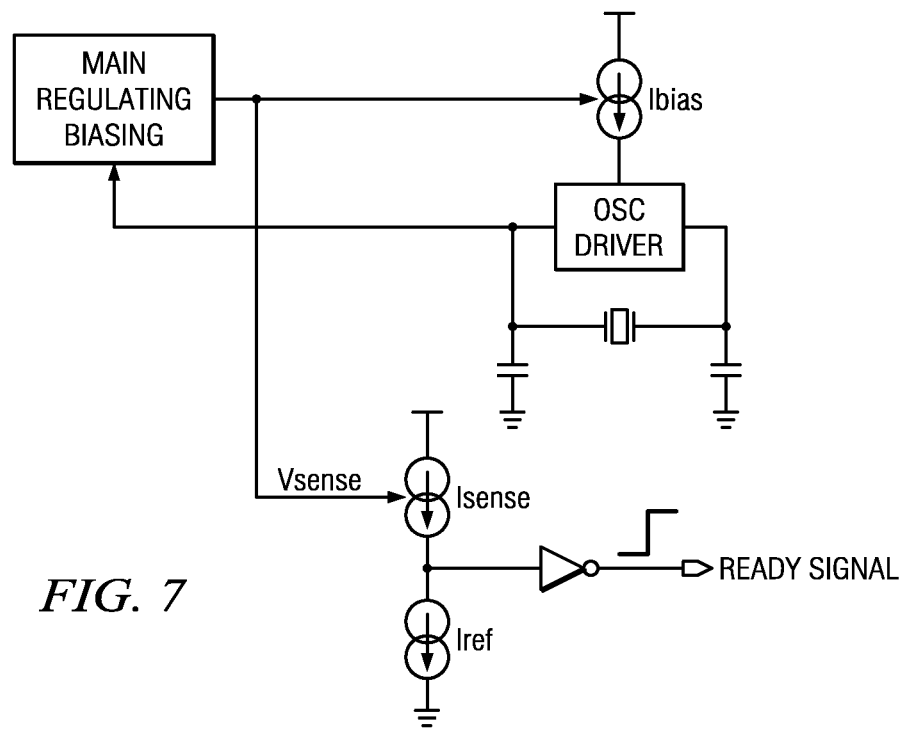
FIG. 7 is a basic circuit diagram that illustrates the functioning principle of the novel method of this disclosure.

FIG. 7 schematically illustrates this fundamental principle of the novel method of this disclosure. The bias current regulating signal V$_{SENSE}$ conveyed by the B$_{IAS}$ R$_{EG}$ circuit to the bias current generator I$_{BIAS}$ of the driver circuit O$_{SC}$ D$_{RIVER}$ of the crystal oscillator is made to control a current generator I$_{SENSE}$, the current of which is compared with a reference current of a chosen value I$_{REF}$ in order to generate the required "ready" flag signal when the current I$_{SENSE}$ (replica of I$_{BIAS}$) drops to or below the threshold value I$_{REF}$.

Figure 8:
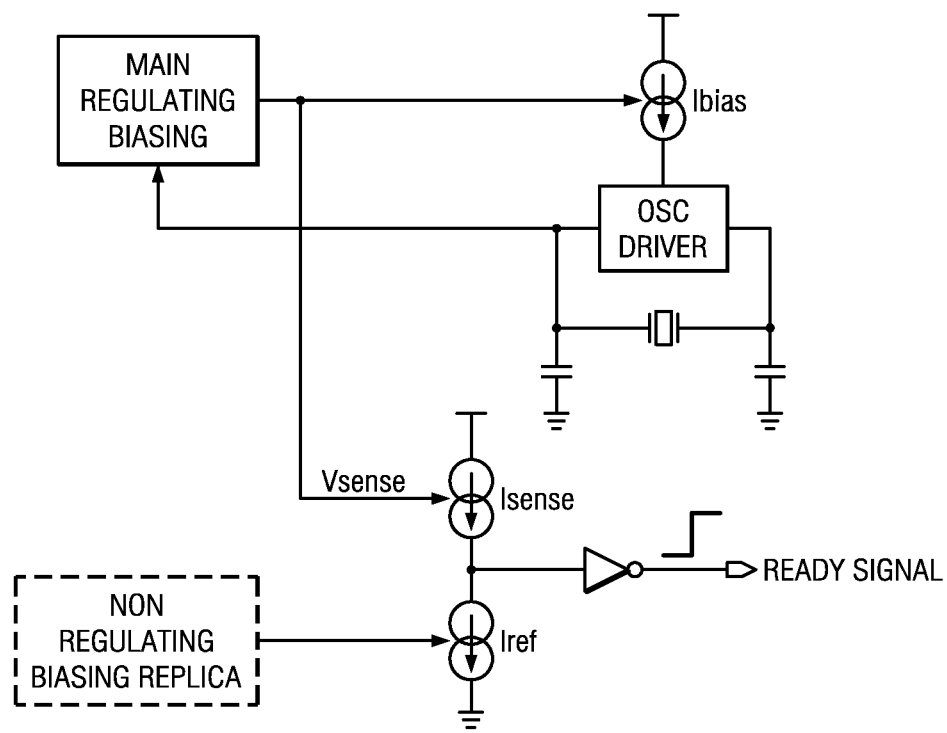
FIG. 8 is a basic circuit diagram that illustrates the functioning principle of an enhanced embodiment of the novel method of this disclosure.

FIG. 8 schematically illustrates an alternative embodiment of the novel method of this disclosure wherein instead of a comparison with a chosen reference value I$_{REF}$, comparison is made with perfectly matched replica of the main regulating bias circuitry, as will be described in more detail later in this description.

Figure 9:
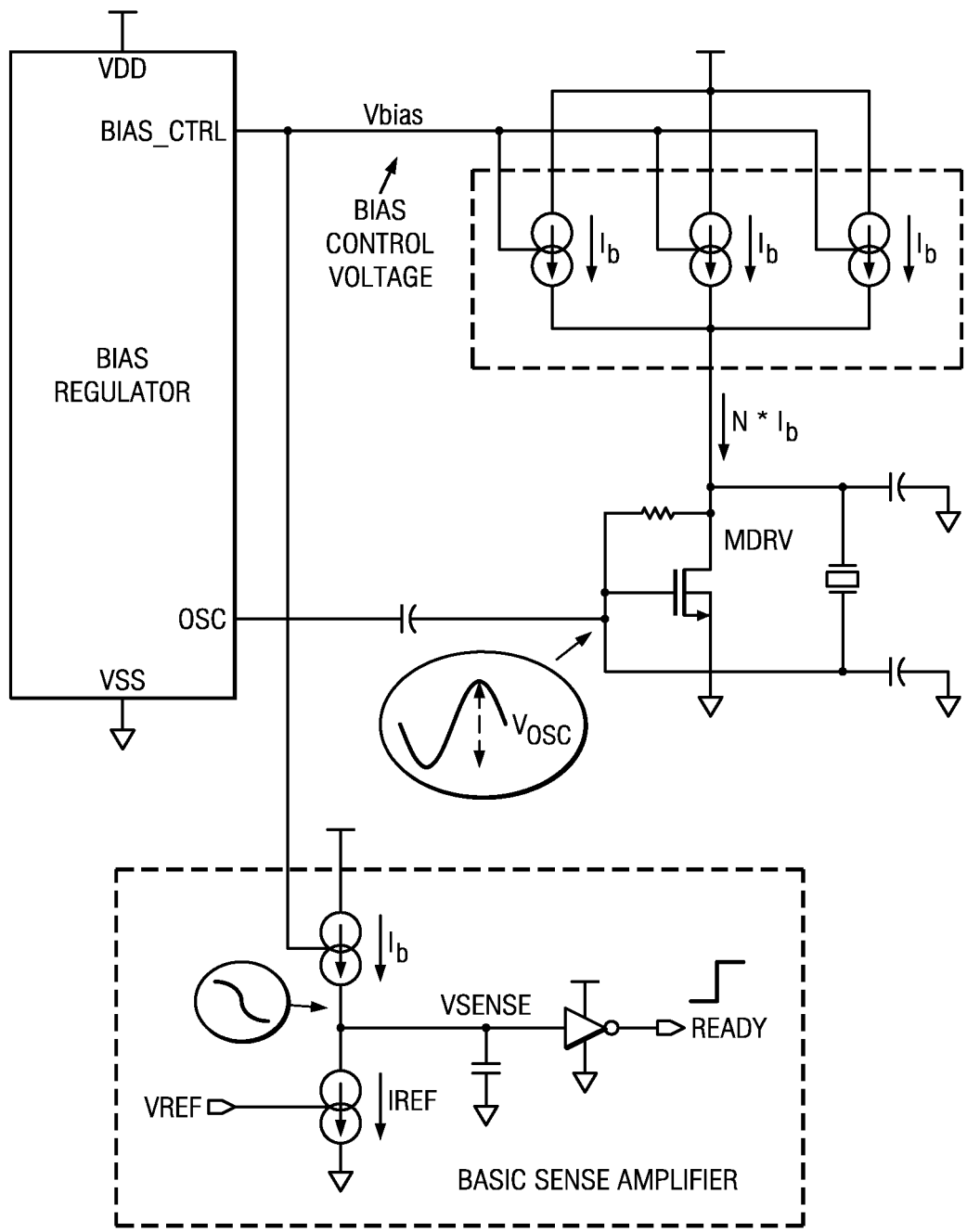
FIG. 9 is a circuit diagram showing an exemplary embodiment of the circuitry of generation of a "ready" flag signal implementing the scheme of FIG. 7.

FIG. 9 shows a circuit implementing the basic scheme of FIG. 7, in the assumption that the driver circuit conditions at start-up be configurable. Accordingly, the digitally controlled start-up current is contributorily generated by several replicas of a bias cell or module I$_{BIAS}$ of a biasing current mirror. A chosen number of substantially identical individual cells are enabled according to the start-up condition to be implemented. Therefore, the bias current of the driver circuit may usually be defined in terms of N times (integer multiple) the current Ib generated by any of the unit cells I$_{BIAS}$, that is N*Ib. Of course, even a fraction of the Ib current could be added if desirable.

In substitution of the D$_{IGITAL}$ D$_{ELAY}$ block of the circuit topologies of the prior art, a current sense amplifier is used for comparing the current of a bias current cell or module I$_{BIAS}$ with a chosen reference current I$_{REF}$, the value of which may be smaller by a reliably detectable measure than the configured start-up value of bias current to be imposed in the driver circuit of the crystal oscillator.

The reference value I$_{REF}$ may for example be generated with any appropriate means, for example with a common band-gap reference signal generator, and preferably corresponds to a chosen percentage of the configured start-up bias current, thus ensuring a substantial tracking of the configuration choices.

Figure 10:
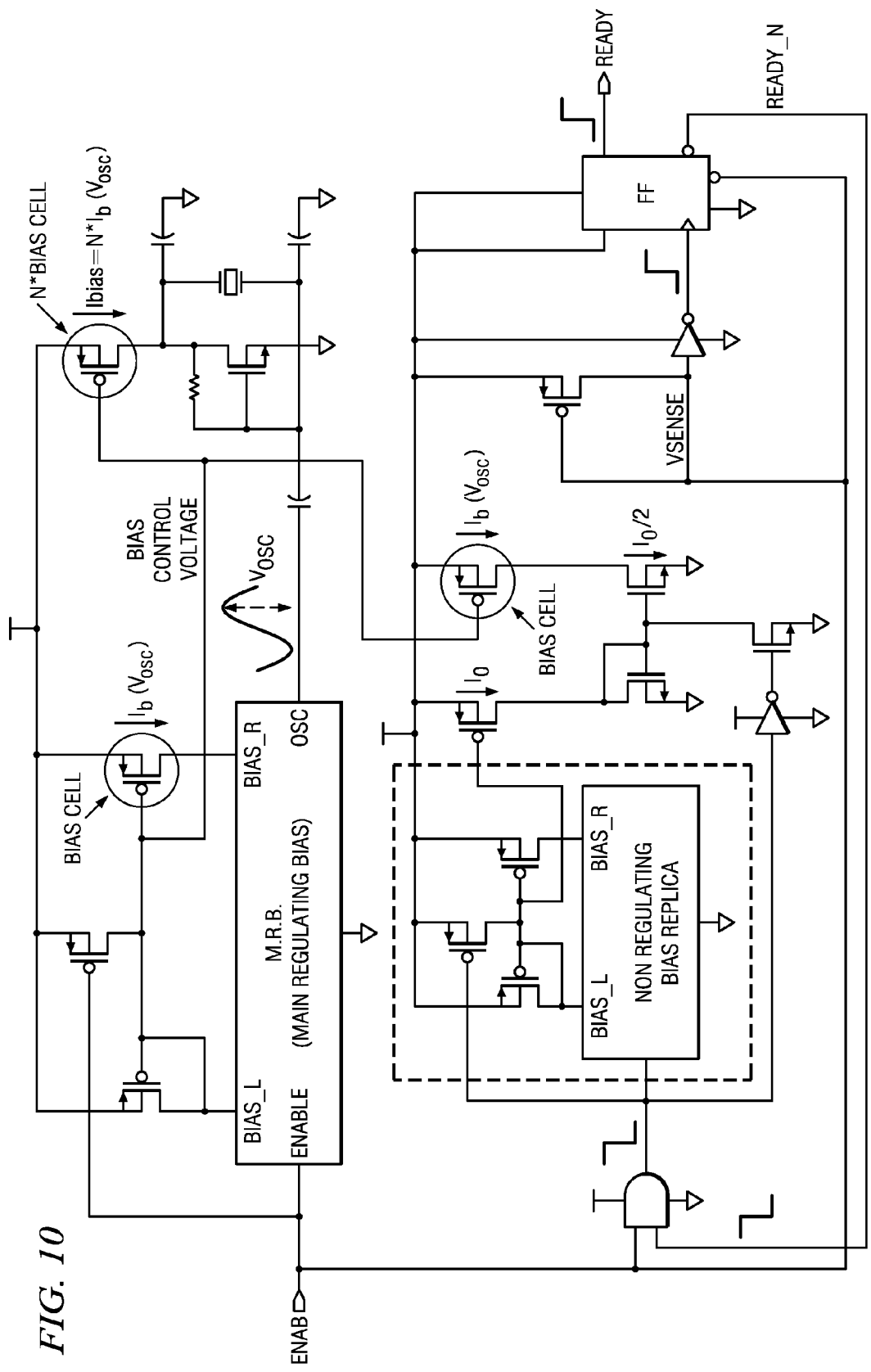
FIG. 10 is a circuit diagram showing an alternative exemplary embodiment of the circuitry of generation of a "ready" flag signal implementing the enhanced scheme of FIG. 8.

FIG. 10 shows a circuit implementing the basic scheme of FIG. 8, according to the alternative embodiment of the novel method of this disclosure wherein instead of a comparison with a chosen reference value I$_{REF}$, comparison is made with perfectly matched replica of the main regulating bias circuitry Let I0 be the start-up value of the bias current cell value Ib, imposed in a digitally configured multiple number (Ibias=N*Ib), in the driver circuit of the crystal oscillator; the block NON REGULATING BIAS REPLICA functions as a "memory element" which keeps track of the start-up current value I0 provided by a bias cell or module not involved in the regulating mechanism. This current, properly mirrored and scaled, is then confronted with the current replica of the Ib value. The instant at which the current value Ib of the regulating bias current crosses the scaled replica (e.g. I0/2 as contemplated in the circuit of FIG. 10) of its start-up value (according to the chosen configuration of the start-up conditions) is then precisely detected. According to the exemplary circuit of FIG. 10, a memory cell FF is used for storing the generated X-Osc "ready" flag signal. In this way, the circuitry associated to the NON REGULATING BIAS REPLICA can be disabled after having detected the regulation event, eliminating any no longer necessary current consumption.

It is evident the fact that the bias current regulation event at start-up that is detected, that is when I$_{BIAS}$ crosses I$_{REF}$, is now strictly tied to the physical and electrical parameters of the circuit regardless of the spread of characteristics of the crystal and of the implemented start-up configuration.

This alternative embodiment enhances reliability of the regulation event sensing because the reference is precisely tracked to the configured level of start-up bias current and this may even produce a finer limitation of the timeout.

Figure 11:
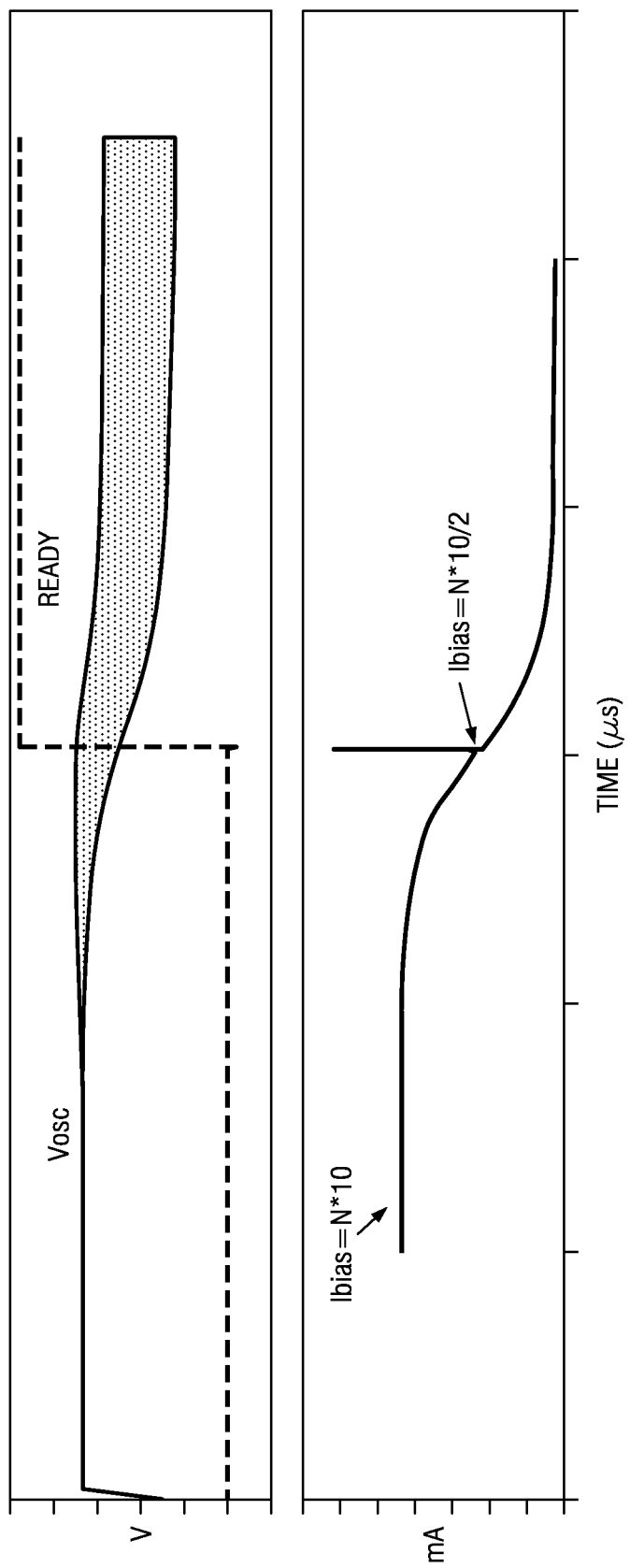
FIG. 11 illustrates time diagrams of a start-up transient when implementing the novel method of this disclosure showing that the "ready" flag signal is generated in coincidence of a precisely detected analog condition of amplitude regulation that is actuated by the driver circuit of the crystal oscillator at start-ups.

FIG. 11 shows the related time diagrams of the regulation event sensing.

Of course many other alternative embodiments of the method of this disclosure are possible, especially in connection with the manner in which a properly scaled replica of the configured start-up bias current to be used as reference for the regulation event detection.

In any case, the novel method avoids the consequences of a precautionary overestimated timeout by performing a punctual analog detection of the incipient cessation of the start-up phase of regulation of the bias current in the driver circuit of an amplitude-regulated master crystal oscillator. This is welcome in low power applications or whenever it is desirable to enable as soon as possible clock distribution.

What is claimed is:

1. A method of regulating a timeout delay introduced at start-up of a digital system to ensure that an amplitude-regulated master crystal oscillator, including a current biased driver circuit, has stabilized and generates a proper sinusoidal waveform, the method comprising:
   detecting a state of bias current regulation of said amplitude-regulated master crystal oscillator, wherein detecting comprises:
      monitoring bias current in the current biased driver circuit in order to sense an instant at which the monitored bias current crosses a threshold; and
   regulating the timeout delay being introduced at start-up according to said detection.

2. The method of claim 1, wherein the threshold corresponds to a fixed percentage of a bias current start-up value.

3. The method of claim 1, wherein the threshold corresponds to a reference current value.

4. The method of claim 1, wherein detecting the state of bias current regulation of said amplitude-regulated master crystal oscillator comprises:
   monitoring a bias current regulating control signal output by a bias current regulation circuit; and
   detecting an instant at which the bias current regulating control signal decreases from a full start-up value and the generated sinusoidal waveform reaches a steady state amplitude.

5. The method of claim 4, wherein detecting comprises comparing the regulating control signal to a reference signal generated by a dedicated reference signal generator.

6. The method of claim 4, wherein said dedicated reference signal generator is a replica of said bias current regulation circuit.

7. The method of claim 1, further comprising tracking a configured start-up current value as generated by a dedicated bias current generator that does not produce bias current regulation in the driver circuit of the crystal oscillator.

8. A method, comprising:
   applying a control signal to generate a bias current for application to a crystal oscillator circuit configured to output an oscillation signal;
   generating a sense current from said applied control signal;
   comparing the sense current to a reference current; and
   generating in response to said comparison a ready signal indicating said oscillation signal is ready for use.

9. The method of claim 8, wherein said reference current is generated from a regulated circuit.

10. The method of claim 8, wherein said reference current is generated from a non-regulated circuit.

11. The method of claim 10, further comprising:
    generating a bias current which replicates the bias current applied to the crystal oscillator circuit; and
    generating the reference current from the replicated bias current.

12. A circuit, comprising:
    a) a bias current generating circuit having unit cells configured to be controlled in common by an amplitude regulating control signal to contributorily generate bias current for application to a crystal oscillator;
    b) a bias regulator circuit configured to receive a scaled replica of an output sinusoidal signal generated by the crystal oscillator and output said amplitude regulating control signal; and
    c) a comparator configured to sense when a sense current generated from said amplitude regulating control signal crosses a threshold and generate in response to said comparison a flag signal indicative of readiness of the crystal oscillator.

13. The circuit of claim 12, wherein the threshold corresponds to a fixed reference current value.

14. The circuit of claim 12, further comprising
    d) a circuit configured to replicate said bias regulator circuit and generate a replica current; and
    e) a mirroring and scaling circuit configured to mirror and scale the replica current;
    wherein said comparator is configured to determine when the sense current crosses a threshold current corresponding to said mirrored and scaled replica current.

15. The circuit of claim 14, further comprising circuitry configured to disable the replica of said bias regulator circuit in response to said flag signal.

16. The circuit of claim 12, further comprising a memory cell configured to store the generated readiness flag signal.

17. A circuit, comprising:
    a bias circuit operable in response to a control signal to generate a bias current for application to a crystal oscillator circuit configured to output an oscillation signal;
    a current generator operable to generate a sense current from said applied control signal; and
    a comparator circuit operable to compare the sense current to a reference current and generate a ready signal in response to the comparison indicating said oscillation signal is ready for use.

18. The circuit of claim 17, wherein said reference current is generated from a regulated circuit.

19. The circuit of claim 17, wherein said reference current is generated from a non-regulated circuit.

20. The circuit of claim 17, further comprising:
    a first circuit operable to generate a bias current which replicates the bias current applied to the crystal oscillator circuit; and
    a second circuit operable to generate the reference current from the replicated bias current.

21. The circuit of claim 20, wherein the first circuit is a replica of said bias circuit.

* * * * *